US006089689A

United States Patent [19]

Suzuki

[11] Patent Number: 6,089,689

[45] Date of Patent: Jul. 18, 2000

[54] INK EJECTION CONTROL METHOD AND APPARATUS FOR USE WITH INK JET PRINTER

[75] Inventor: Shogo Suzuki, Nagoya, Japan

[73] Assignee: Brother Kogyo Kabushiki Kaisha, Nagoya, Japan

[21] Appl. No.: 09/033,861

[22] Filed: Mar. 3, 1998

[30] Foreign Application Priority Data

Mar. 5, 1997 [JP] Japan .................................... 9-050564

[51] Int. Cl.[7] .............................. B41J 29/38; H01L 41/04

[52] U.S. Cl. ............................................ 347/10; 310/326

[58] Field of Search ..................................... 310/317, 318, 310/326; 347/5, 9, 10, 11, 12

[56] References Cited

U.S. PATENT DOCUMENTS

| | | | |
|---|---|---|---|
| 4,535,346 | 8/1985 | Lichti | 346/140 |
| 5,821,953 | 10/1998 | Nakano et al. | 347/10 |

FOREIGN PATENT DOCUMENTS

| | | |
|---|---|---|
| 58-059855A | 4/1983 | Japan . |
| 8-025626A | 1/1996 | Japan . |
| 9-207360A | 8/1997 | Japan . |

*Primary Examiner*—Susan S. Y. Lee
*Assistant Examiner*—Hoang Ngo
*Attorney, Agent, or Firm*—Oliff & Berridge, PLC

[57] ABSTRACT

A printer includes an inductor connected in a power supply line to piezoelectric elements for ejecting ink. When a drive voltage rises or falls, an undershoot and an overshoot which become large in proportion to the number of the driven piezoelectric elements are caused in a drive current by the inductor. As a result, when the number of the driven piezoelectric elements increases, the drive voltage for driving the piezoelectric elements increases and the pressure applied to the ink increases. Thus, the decrease in the ink ejection speed due to the influence of a crosstalk phenomenon can be avoided, and hence an image formed on a paper becomes more even.

8 Claims, 6 Drawing Sheets

INK EJECTION CONTROL METHOD AND APPARATUS FOR USE WITH INK JET PRINTER

CROSS REFERENCE TO RELATED APPLICATION

This application relates to and incorporates herein by reference Japanese Patent Application No. 9-50564 filed on Mar. 5, 1997.

BACKGROUND OF THE INVENTION

1. Field of the Invention

The present invention relates to a method and an apparatus for controlling ink ejection of an ink jet printer.

2. Related Art

As an actuator for actuating a printer head mounted on an ink jet printer, a piezoelectric element, which expands/contracts in response to application of a voltage to change the volume of an ink reservoir formed within the actuator is used so that ink within the ink reservoir is pressurized and ejected from the actuator to the outside.

This type of actuator denoted by reference numeral 40 in FIG. 8 comprises a base 41, a piezoelectric member 42, a diaphragm 43, a cavity plate 44 and a nozzle plate 45.

The nozzle plate 45 is a flat plate having a number of (e.g., 128) ink ejection holes 45*a* defined therein in two lines D and E. The cavity plate 44 includes two sets of L-shaped ink ducts 44*a*, and ink reservoirs 44*b* diverged at a right angle from the ink ducts 44*a*. The number of reservoirs 44*b* corresponds to the number of ink ejection holes 45*a* in nozzel plate 45. Each of the ink reservoirs 44*b* is communicated with one of the corresponding ink ejection holes 45*a*.

The piezoelectric member 42 includes a number of (e.g., 128) piezoelectric elements 42*a* so as to expand/contract the respective ink reservoirs 44*b*. The diaphragm 43 is flexible and isolates the piezoelectric member 42 and the cavity plate 44 from each other.

The base 41 supports the above parts of the actuator 40. Two outward paths 41*a* and two inward paths 41*b* are formed through the base 41, the piezoelectric member 42 and the diaphragm 43 in order to circulate ink through an ink tank (not shown) and the ink ducts 44*a*.

As shown in FIG. 9A, each ink reservoir 44*b* formed on the cavity plate 44 is coupled to the ink duct 44*a* through a communicating path 44*c*, and has on its lower portion an orifice 44*d* formed to be in communication with the ink ejection hole 45*a*.

With an application of a drive voltage, the piezoelectric element 42*a* is expanded in direction shown by arrow X to thereby contract the volume of the ink reservoir 44*b* as shown by a dashed line Y. When the drive voltage thus applied is released from the piezoelectric element 42*a*, the piezoelectric element 42*a* is contracted and returned to the initial state.

In this actuator 40, ink is supplied with pressure from an ink tank (not shown) through the pair of outward paths 41*a* to the pair of ink ducts 44*a* to fill the ink ducts 44*a* with the ink. Then, when the drive voltage applied to the piezoelectric element 42*a* disappears, the piezoelectric element 42*a* contracts to introduce the ink from the ink duct 44*a* through the communicating path 44*c* to the ink reservoir 44*b*, thereby filling the ink reservoir 44*b* with ink. When the drive voltage is applied to the piezoelectric element 42*a* to contract the volume of the ink reservoir 44*b*, whereby ink is ejected through the orifice 44*d* to the outside.

While the printer head (not shown) scans a print medium (not shown), ink is ejected from each ink ejection hole 45*a* by expanding/contracting each piezoelectric element 42*a* based on desired print data, whereby a desired image can be printed on the print medium.

As the ink is thus ejected from the actuator 40 by expanding/contracting each piezoelectric element 42*a*, a crosstalk phenomenon in which an ink ejection amount is decreased at the same time the ink ejection speed is decreased may frequently occur if a large number of piezoelectric elements 42*a* expand/contract simultaneously. The crosstalk phenomenon is classified into two types. That is, the crosstalk phenomenon is caused by the insufficient rigidity of the cavity plate 44 or by change in pressure wave within the ink.

More specifically, in one type of crosstalk, when a large number of piezoelectric elements 42*a* are expanded/contracted, e.g., all piezoelectric elements 42*a* contract to fill the ink reservoirs 44*b* with ink, as shown by arrows O in FIG. 9B, the ink flows from the ink duct 44*a* into the ink reservoirs 44*b*. When all piezoelectric elements 42*a* expand to apply pressure to the ink to eject the ink from the ink ejection holes 45*a*, much pressure of the ink is simultaneously applied to the cavity plate 44, so that the cavity plate 44 is curved or deformed in the direction in which the pressure is applied. As a consequence, a little pressure of the ink is propagated to and absorbed by the cavity plate 44, whereby an ejection speed at which the ink is ejected from the ink ejection holes 45*a* is lowered. Thus, the ink ejection amount is decreases.

In the other type of crosstalk, when all piezoelectric elements 42*a* are contracted, the pressure in the inside of the ink reservoirs 44*b* is considerably lowered so that the ink rapidly flows into the inside of the ink reservoirs 44*b*. Then, the pressure of the ink in the inside of the ink reservoirs 44*b* becomes excessively large. Because of the characteristics of liquid ink, the pressure state of the ink is balanced. The ink flows backward from the ink reservoirs 44*b* to the ink ducts 44*a*. In this manner, the ink alternately flows from the ink reservoirs 44*b* to the ink ducts 44*a* or vice versa, thereby causing the pressure wave to occur within the ink. Then, the pressure wave occurs at every ink reservoir 44*b* and interferes with the ink ducts 44*a*. Further, the interfering pressure wave interferes with the pressure applied to the ink to lower the pressure of the ink.

Since the pressure produced by expanding the piezoelectric elements 42*a* is lowered by the crosstalk phenomenon, the ink ejection speed is lowered, and at the same time, the ink ejection amount is decreased. As a result, when the ink is ejected from the actuator 40 while the head scans the print medium, the ejected ink drops are attached to the print medium at its portions different from the expected portions. Moreover, the ink ejection amount changes depending on the number of the piezoelectric elements 42*a* to be driven. Thus, an image printed on the print medium changes unevenly degrading a sharpness of the printed image.

SUMMARY OF THE INVENTION

It is therefore an object of the present invention to provide method of and apparatus for controlling an ink ejection of an ink jet printer so that influence of crosstalk is reduced for a more even printing operation.

According to one aspect of the present invention, a drive voltage is increased in proportion to the number of piezoelectric elements so that each piezoelectric element is deformed much more as the number of the piezoelectric elements driven increases. The increased drive voltage largely expands/contracts a volume of an ink reservoir. Thus, the decrease of the pressure within the ink reservoir due to crosstalk phenomenon can be supplemented.

According to another aspect of the present invention, an inductor is provided in a power supply line through which a drive voltage is applied to each piezoelectric element. When the drive voltage rises or falls, an overshoot or an undershoot occurs in a drive current which flows through the power supply line. Since this overshoot or undershoot is proportional to the drive current, the magnitude of the overshoot or the undershoot becomes large as the number of piezoelectric elements increases. Thus, the drive voltage applied to each piezoelectric element when ink is ejected can be increased by the overshoot and the undershoot of the drive current in proportion to the increase in the number of the driven piezoelectric elements.

BRIEF DESCRIPTION OF THE DRAWINGS

Other objects, features and advantages of the present invention will become more apparent from the following detailed description made with reference to the accompanying drawings. In the drawings.

DETAILED DESCRIPTION OF THE PREFERRED EMBODIMENT

Figure 1:
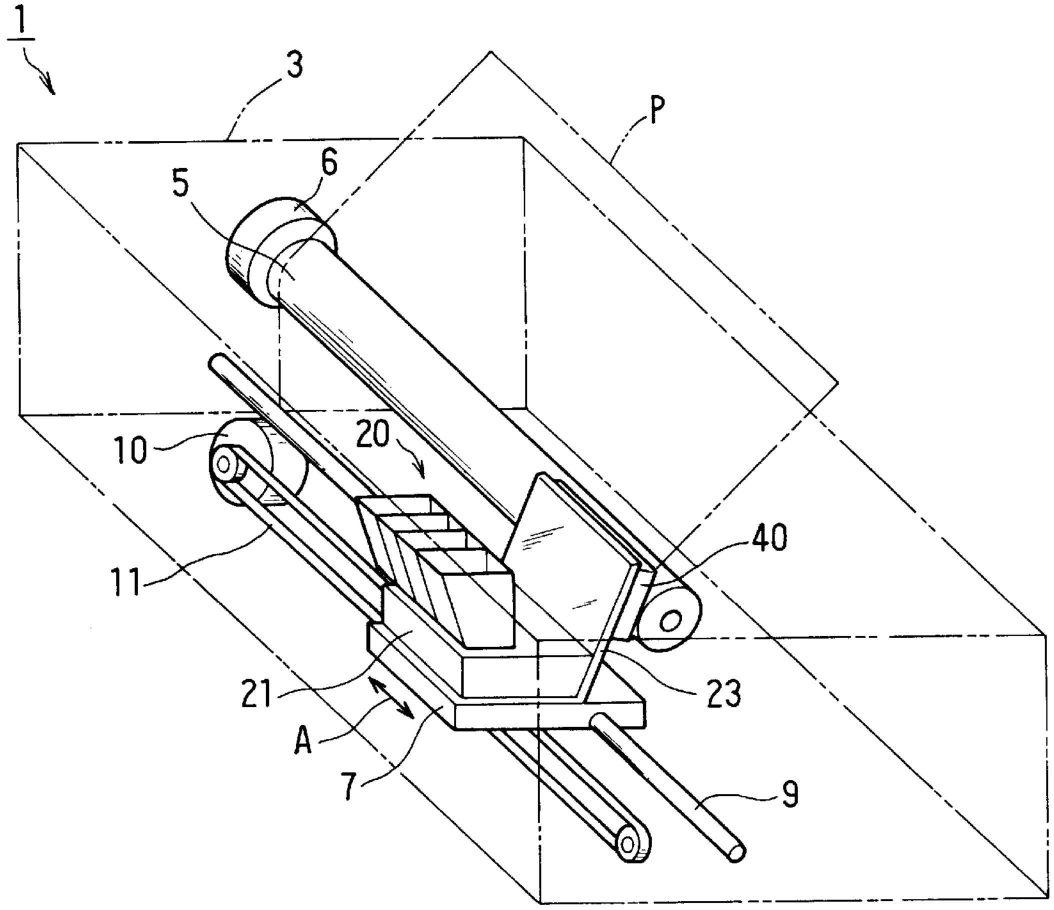
FIG. 1 is a perspective view showing a printer in which an embodiment of the present invention is implemented.

An ink ejection control apparatus according to the present embodiment is applied to an ink jet printer. As shown in FIG. 1, the printer 1 has a housing 3 provided therein a transport roller 5 driven by a transport motor 6 to transport a paper P which serves as a print medium in the upper direction of the printer 1, and a printer head 20 which is supported on a carriage 7 located in the transport path of the paper P. The carriage 7 is supported by a supporting rod 9 fixed to the housing 3 so that it can be freely slid in the direction shown by arrow A perpendicular to the transport direction of the paper P. The carriage 7 is secured to a timing belt 11 driven by a carriage motor 10 and is able to move in the arrow A directions reciprocally.

The head 20 includes at least ink tanks 21 for the ink of four colors (yellow, magenta, cyan and black), an actuator 40 for ejecting ink of the four colors, and a front panel 23 for transporting an ink from each ink tank 21 to the actuator 40.

Figure 8:
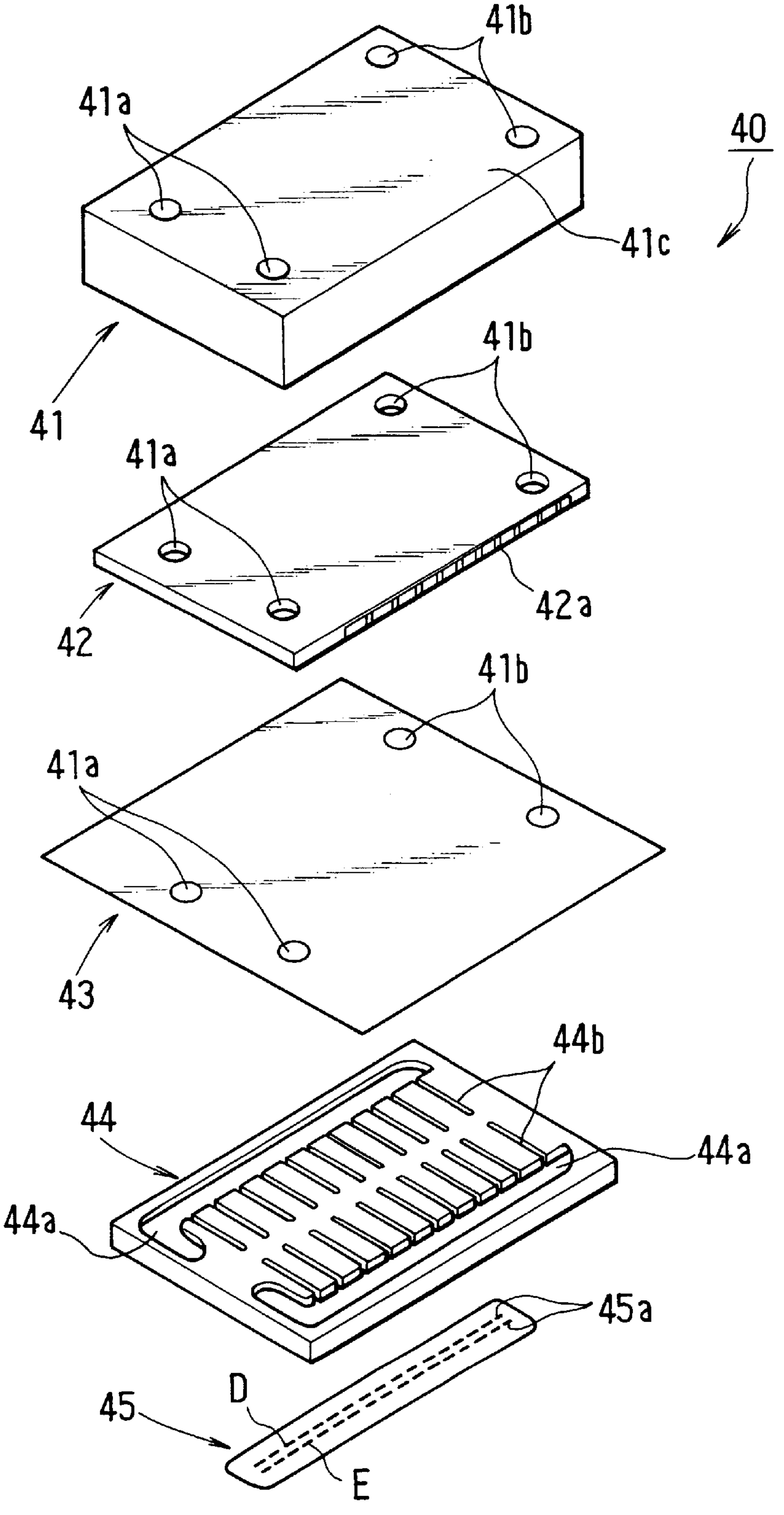
FIG. 8 PRIOR ART
FIG. 8 is an exploded perspective view showing a conventional actuator in a printer head.

The actuator 40 is arranged similarly to the conventional one shown in FIG. 8. The ink ejection holes 45*a* are numbered as #1 to #128 in this embodiment. Specifically, the ink ejection holes 45*a* on the left column D are odd-numbered and the ink ejection holes 45*a* on the right column E are even-numbered. The ink ejection holes 45*a* are numbered to progressively increment. For example, the lowermost ink ejection hole 45*a* on the left column D is numbered as #1, the topmost ink ejection hole 45*a* on the left column D is numbered as #127, the lowermost ink ejection hole 45*a* on the right column E is numbered as #2, and the topmost ink ejection hole 45*a* on the right column E is numbered as #128. Moreover, the piezoelectric element 42*a* deforms by expansion/contraction thereof.

Figure 2:
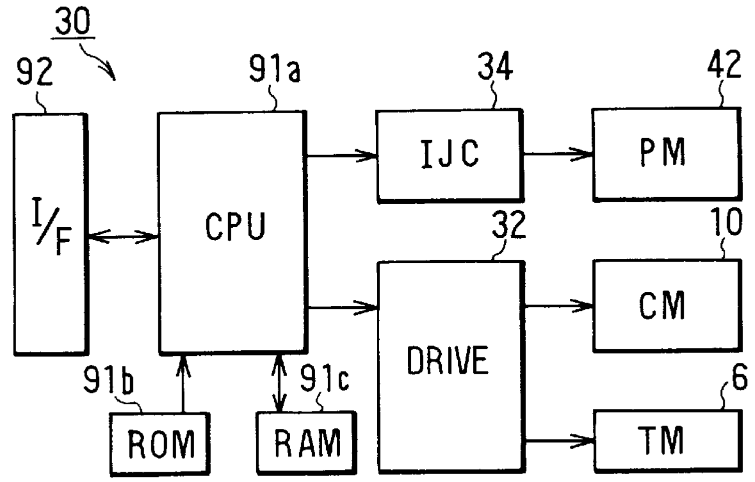
FIG. 2 is a block diagram showing an electronic control apparatus used in the printer shown in FIG. 1.

The printer 1 has an electronic control apparatus 30 constructed as shown in FIG. 2. The control apparatus 30 includes a CPU (central processing unit) 91*a* for performing programmed calculations, a ROM (read-only memory) 91*b* and a RAM (random-access memory) 91*c* for storing therein programs and parameters necessary for controlling the printer 1, an interface (I/F) 92 for exchanging data necessary for printing between the printer 1 and a personal computer (not shown), a drive circuit 32 for driving a carriage motor (CM) 10 and a transport motor (TM) 6 based on control signals from the CPU 91*a*, and an ink ejection control circuit (IJC) 34 for expanding/contracting each piezoelectric element 42*a* of a piezoelectric member (PM) 42 to eject ink from the actuator 40.

Figure 3:
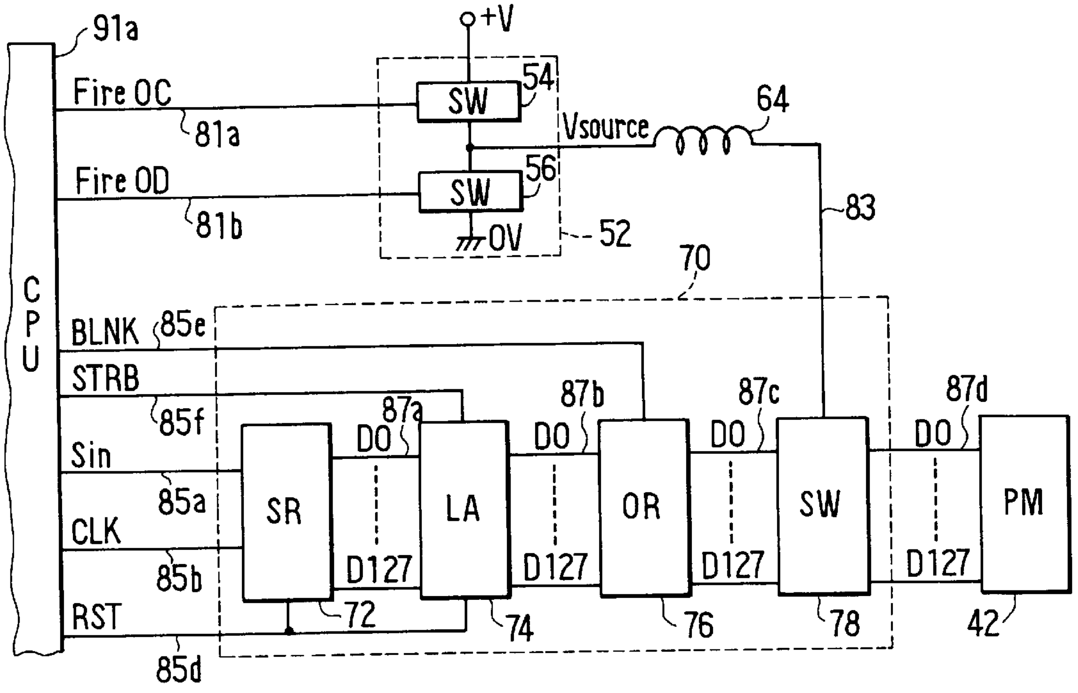
FIG. 3 is a block diagram showing an ink ejection control circuit in the electronic control apparatus shown in FIG. 2.

As shown in FIG. 3, the ink ejection control circuit 34 includes a pulse amplifier 52 for supplying a Vsource voltage to each piezoelectric element 42*a* of the piezoelectric member 42, and a driver IC (integrated circuit) 70 capable of opening/closing power supply bus 87*d* (D0–D127) through which the Vsource voltage is supplied to corresponding piezoelectric elements 42*a*.

Further, an inductor 64 is connected in series with a power supply line 83 between the pulse amplifier 52 and the driver IC 70. The inductor 64 is adapted to cause a drive current flowing through the power supply line 83 to be delayed by its inductance. As a result, when the drive current flowing through the power supply line 83 changes at the leading edge or the trailing edge, an overshoot or undershoot occurs.

The pulse amplifier 52 is adapted to supply a +V voltage or the 0V voltage to the piezoelectric member 42 as a drive voltage (Vsource) for expanding/contracting the piezoelectric elements 42*a*. The pulse amplifier 52 includes a switch circuit (SW) 54 for supplying the +V voltage to the piezoelectric member 42 and a switch circuit 56 for supplying the V voltage to the piezoelectric member 42.

The switch circuit 54 outputs the +V voltage as the Vsource voltage in response to a Fire0C signal of High level supplied thereto from the CPU 91*a* through a signal line 81*a*. The switch circuit 56 sets the Vsource voltage to 0V in response to a Fire0D signal of High level which is supplied from the CPU 91*a* through a signal line 81*b*.

The driver IC 70 includes a shift register (SR) 72, a latch (LA) 74, an OR gate 76 and an analog switch (SW) 78.

The shift register 72 shifts a Sin signal which determines opening/closing of 128 analog switches supplied as digital serial data from the CPU 91*a* through a signal line 85*a* in response to a CLK signal (clock pulse signal having a cycle corresponding to a transfer rate of serial data) transmitted from the CPU 91*a* through a signal line 85*b*. The parallel output signals are outputted through a bus (128 bus lines) 87*a* to the latch 74 as D0 to D127 signals.

The latch 74 latches the D0 to D127 signals outputted from the shift register 72 through the bus 87*a*, and outputs simultaneously the D0 to D127 signals through a bus 87*b* to the OR gate 76 in response to an STRB (strobe) signal inputted thereto from the CPU 91*a* through a signal line 85*f.*

The OR gate 76 supplies the D0 to D127 signals through a bus 87*c* to the analog switch 78 when the D0 to D127 signals are transmitted from the latch 74 through the bus 87*b*. The OR gate 76 outputs the D0 to D127 signals of High level to all bus lines of the bus 87*c* connected to the analog switch 78 when a BLNK signal is transmitted from the CPU 91*a* through a signal line 85*e.*

The analog switch 78 opens/closes the 128 power supply bus 87*d* through which the Vsource voltage supplied from the power supply line 83 is supplied to the respective piezoelectric elements 42*a*. The analog switch 78 closes the power supply bus 87*d* corresponding to the D0 signal based on the D0 to D127 signals supplied thereto from the OR gate 76 through the bus 87*c*, for example, when the D0 signal is held at High level. The analog switch 78 opens the power supply bus 87*d* corresponding to the D1 signal when the D1 signal is held at Low level. Thus, the analog switch 78 opens/closes the power supply bus 87*d* corresponding to each of the D0 to D127 signals.

Figure 4:
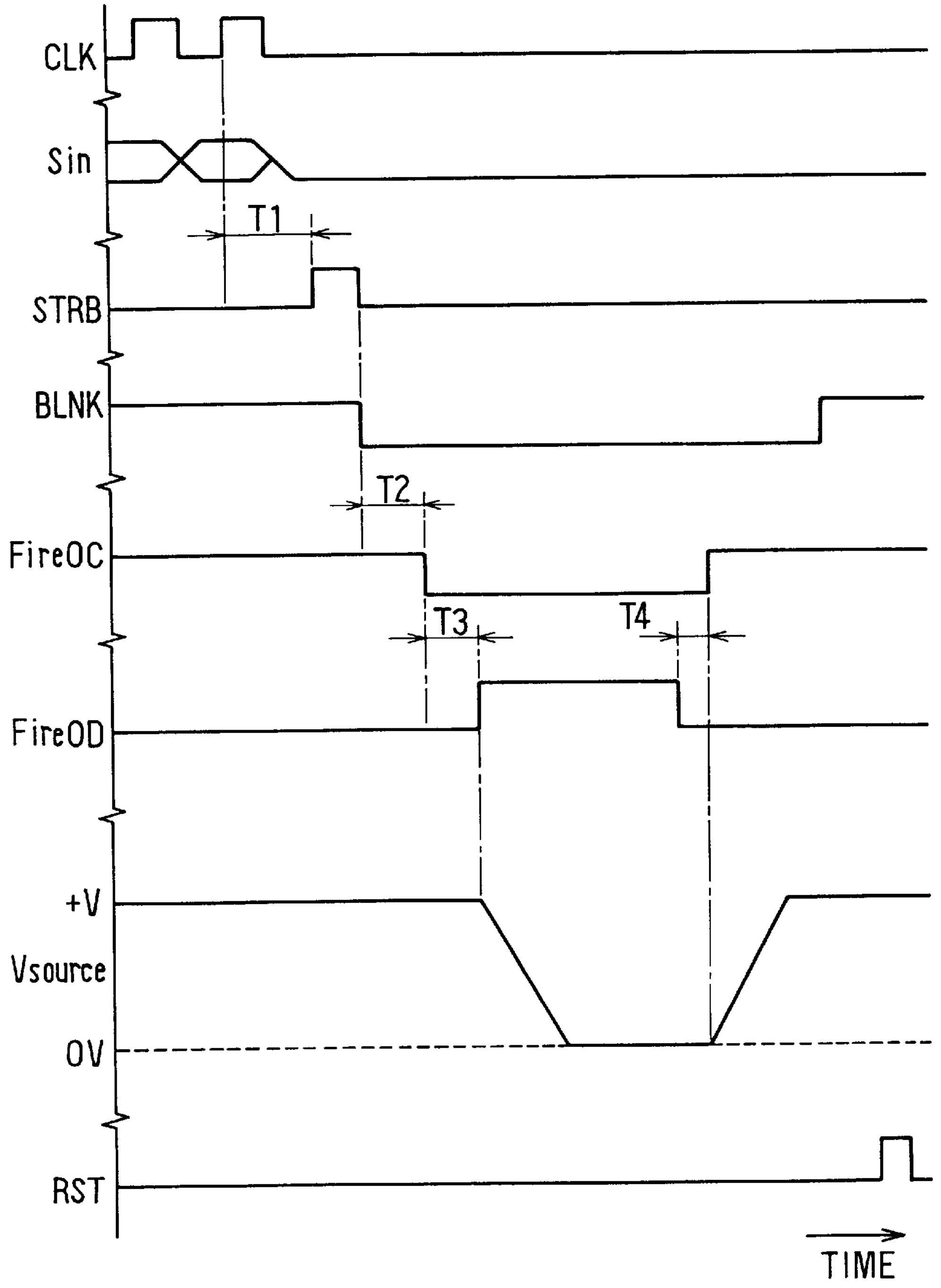
FIG. 4 is a time chart of an ink ejection control performed by the ink ejection control circuit shown in FIG. 3.
Figure 9A:
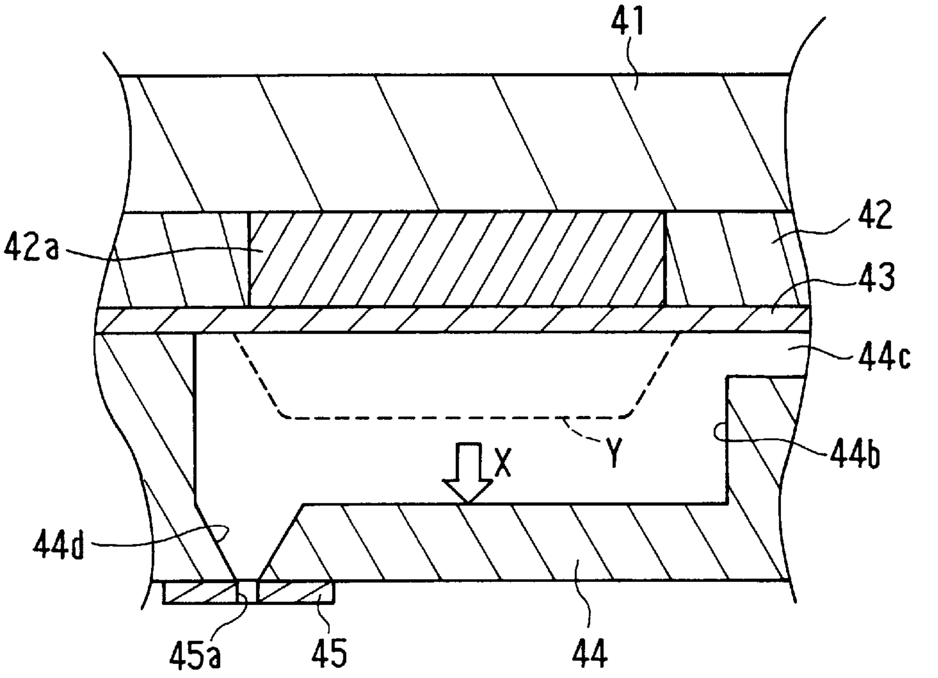
FIG. 9A PRIOR ART
FIG. 9A is a longitudinal cross-sectional view showing the longitudinal section of the actuator shown in FIG. 8.
Figure 9B:
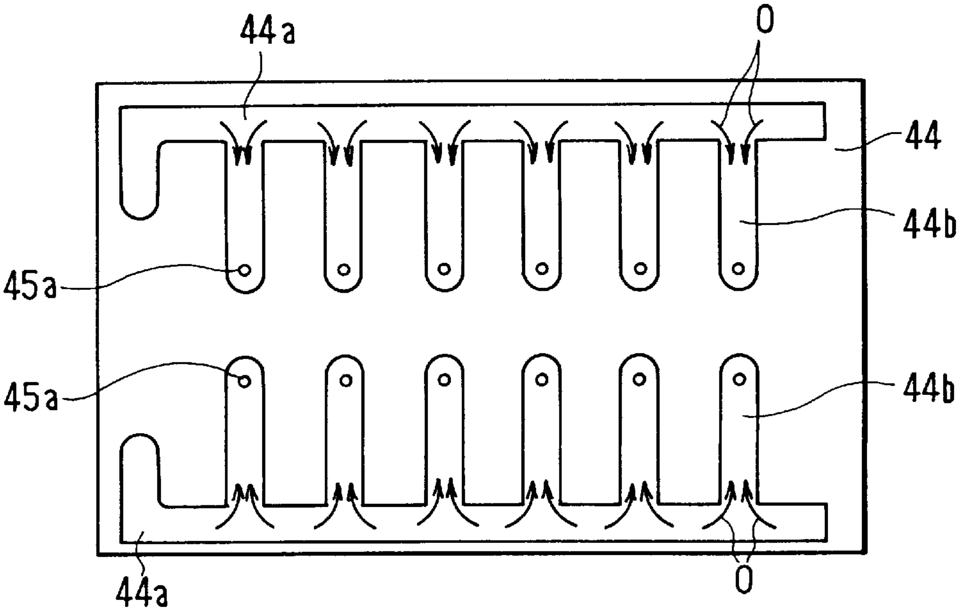
FIG. 9B PRIOR ART
FIG. 9B is a schematic top view showing a cavity plate used in the conventional actuator shown in FIG. 8.

The CPU 91*a* is programmed to control the ink ejection from the actuator 40 in the printer 1 in the manner shown in FIG. 4. It is assumed that the BLNK signal and the Fire0C signal are held at High level as the initial state. The Vsource voltage of the +V voltage is applied to all of the piezoelectric elements 42*a*, resulting in expanding each piezoelectric element 42*a*. Further, the ink ducts 44*a*of the cavity plate 44 are filled with ink as described with reference to FIGS. 8, 9A and 9B.

The CPU 91*a* transmits serially as much data from the entire print data as can be simultaneously transmitted, i.e. 128 print data, to the bus 85*a* as the Sin signal. The print data means collective data corresponding to a set of dots which are converted to allow desired image data (e.g., bit map data) on the personal computer formed as a desired image by yellow, magenta, cyan and black dots in accordance with a resolution (dpi) of the printer 1.

The CPU 91*a* transmits a CLK signal synchronized with the Sin signal, i.e., 128 pulse-like CLK signals. In FIG. 4, the Sin signal shows only the last two of the 128 print data in correspondence with the last two of the 128 pulses in the CLK signal.

The shift register 72 shifts the serial data of the Sin signal based on the CLK signal, and outputs the D0 to D127 signals from the parallel outputs to the bus 87*a*, sequentially. Then, the latch 74 is supplied with the D0 to D127 signals through the bus 87*a*, and latches therein the D0 to D127 signals.

The CPU 91*a* outputs the STRB signal through the bus 85*f* to the latch 74 after a delay time T1 from the leading edge of the last pulse of the CLK signal. When the latch 74 is supplied with the STRB signal, the latch 74 simultaneously outputs the latched D0 to D127 signals to the bus 87*b*.

The CPU 91*a* outputs a BLNK signal of Low level to the signal line 85*e* in response to the trailing edge of the STRB signal. With this Low level BLNK signal, the OR gate 76 produces on its bus 87*c* the same D0 to D127 signals which are produced from the latch 74.

When the analog switch 78 is supplied with this D0 to D127 signals through the bus 87*c*, the analog switch 78 keeps some bus lines in the power supply bus 87*d* corresponding to the signal of High level in the D0 to D127 signals closed, and opens the other bus lines in the power supply bus 87*d* corresponding to the signal of Low level in the D0 to D127 signals.

The CPU 91*a* outputs the Fire0C signal of Low level to the signal line 81*a* with a delay time T2 after outputting the BLNK signal of Low level. Further, the CPU 91*a* outputs the Fire0D signal of High level to the signal line 81*b* with a delay time T3 after outputting the Fire0C signal. When the Fire0D signal rises, the Vsource voltage is changed from the +V voltage to 0V. Among the power supply bus 87*d* of the analog switch 78, the drive voltage of some piezoelectric elements 42*a* corresponding to the closed power supply lines in the bus 87*d* becomes 0V. Other piezoelectric elements 42*a* corresponding to the opened power supply lines in the bus 87*d* hold the +V voltage.

Among the piezoelectric elements 42*a*, the piezoelectric elements 42*a* which receive the 0V voltage contract to expand the volume of the ink reservoir 44*b* of the cavity plate 44, thereby causing ink to flow from the ink duct 44*a* to the ink reservoir 44*b*.

The CPU 91*a* outputs the Fire0D signal of Low level to the signal line 81*b*, and outputs the Fire0C signal of High level to the signal line 81*a* with a delay time T4. When the Fire0C signal rises, the Vsource signal changes from 0V to +V voltage. Accordingly, the +V voltage is charged into the piezoelectric elements 42*a* connected to the closed power supply lines in the bus 87*d*. When charged with the +V voltage, the piezoelectric elements 42*a* expand to contract the volume of the ink reservoir 44*b* to flow ink from the ink ejection holes 45*a*.

The CPU 91*a* outputs the BLNK signal of High level through the signal line 85*e*. Then, all the power supply bus 87*d* are closed, whereby the +V voltage is applied to all of the piezoelectric elements 42*a*. The CPU 91*a* outputs an RST signal through the signal line 85*d* to reset the shift register 72 and the latch 74. In this way, the ink ejection is controlled.

Figure 5:
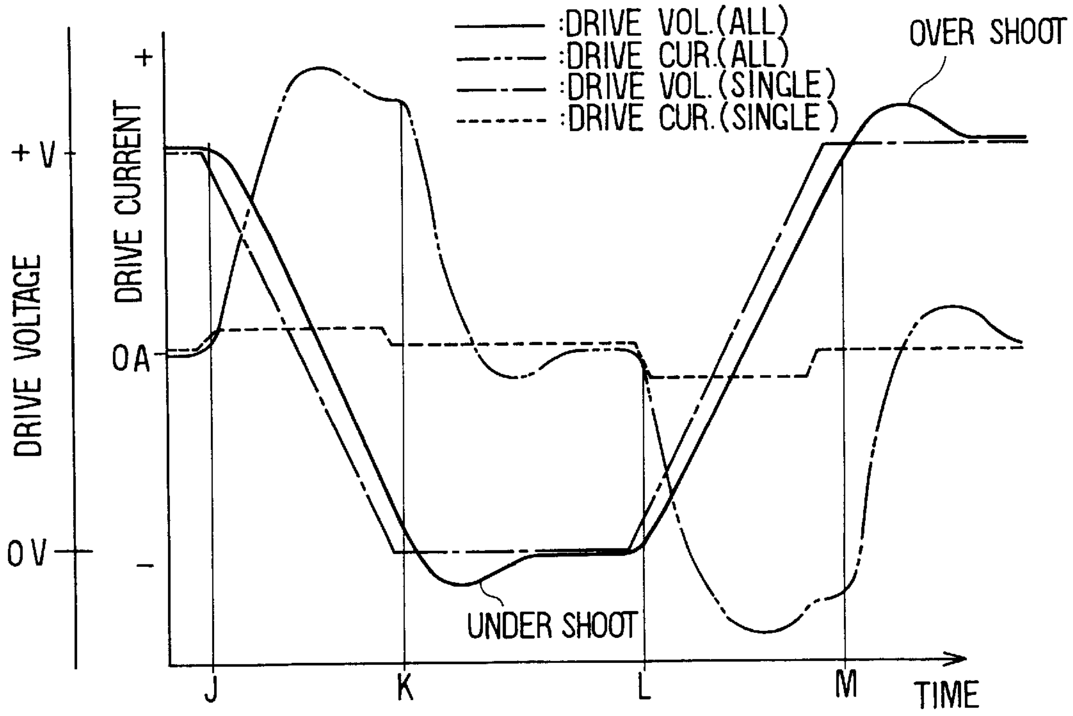
FIG. 5 is a characteristic graph showing a drive voltage V and a drive current I in the ink ejection control.

In the above control, the drive voltage V and current I supplied to the piezoelectric elements 42*a* change in the following manner as shown in FIG. 5.

It is first assumed that only one piezoelectric element 42*a* is driven. This case occurs when only one of the D0 to D127 signals of the bus 87*d* of the analog switch 78, e.g., only D0 signal, is held at High level and all the other signals are held at Low level under the condition that the +V voltage is applied to all of the piezoelectric elements 42*a*.

At a time point J, the CPU 91*a* supplies the Fire0C signal of Low level and the Fire0D signal of High level to the pulse amplifier 52, whereby the Vsource voltage changes from the +V voltage to 0V. On the other hand, since the Vsource voltage changes to 0V relative to the drive voltage V which is held at the +V voltage, the piezoelectric element 42*a* corresponding to the D0 signal discharges electric charges to flow the drive current I. In FIG. 5, the drive current I is defined as the one flowing through the power supply line 83, and the direction of the drive current I is defined to be positive when the electric charges are discharged.

Since each piezoelectric element 42*a* begins to contract in accordance with the flow of the drive current I, each piezoelectric element 42*a* expands the volume of the ink reservoir 44*b* to cause ink to flow thereinto. The flow of the drive current I is continued until the drive voltage V changes to 0V as shown at a time point K although the drive current I is saturated. Then, the volume of the ink reservoir 44*b* is expanded until the drive voltage V changes to 0V, resulting in filling the ink reservoir 44*b* with ink.

At a time point L in which the ink reservoir 44*b* is filled with ink, the CPU 91*a* supplies the Fire0C signal of High level and the Fire0D signal of Low level to the pulse amplifier 52, resulting in setting the Vsource voltage to the +V voltage.

On the other hand, since the drive voltage V of the piezoelectric element 42*a* corresponding to the +V voltage is set to 0V, the drive current I flows through the piezoelectric element 42*a* and electric charges are charged until the drive voltage V becomes the +V voltage. Then, since the piezoelectric element 42*a* corresponding to the D0 signal is expanded to contract the volume of the ink reservoir 44*b* until the drive voltage V becomes the +V voltage, thereby resulting in ejecting ink from the ink ejection holes 45*a*.

At a time point M, when the drive voltage V becomes the voltage +V, the drive current I does not flow any more. Then, the piezoelectric element 42 corresponding to the D0 signal stops expanding, thereby inhibiting ejecting ink from the ink ejection hole 45*a*.

Next, it is assumed that all the piezoelectric elements 42*a* are driven. In this case, all of the D0 to D127 signals of the bus 87*d* of the analog switch 78 are held at High level, and the Vsource voltage of the +V voltage is applied to all of the piezoelectric elements 42*a* as the drive voltage V.

At the time point J, the CPU 91*a* supplies the Fire0C signal of Low level and the Fire0D signal of High level to the pulse amplifier 52, resulting in changing the Vsource voltage from the +V voltage to 0V. On the other hand, since the drive voltage V is held at the +V voltage, the Vsource voltage changes to 0V so that each piezoelectric element 42*a* discharges electric charges and the drive current I flows through the piezoelectric element 42*a*.

When the drive current I flows, each piezoelectric element 42*a* starts contracting, resulting in flowing ink into the ink reservoir 44*b*. Although the flow of the drive current I is saturated, the drive current I flows and is affected by the inductor 64 to cause the overshoot.

At the next time point K, when the drive voltage V of each piezoelectric element 42*a* becomes 0V, the drive current I does not flow any more. In this instance, the drive voltage V is affected by the overshoot of the drive current I to cause the undershoot. Thus, when all piezoelectric elements 42*a* are driven, as compared with the case in which only one piezoelectric element 42*a* is driven, the drive voltage V increases by the amount of the undershoot to thereby contract the piezoelectric elements 42*a* strongly. As a result, much more ink can be introduced into the ink reservoirs 44*b*.

At the time point L in which the ink reservoirs 44*b* are filled with ink, the CPU 91*a* supplies the Fire0C signal of High level and the Fire0D signal of Low level to the pulse amplifier 52, thereby resulting in setting the Vsource voltage to the +V voltage. On the other hand, since the drive voltage V is held at 0V, the drive current I flows through each piezoelectric element 42*a* and electric charges are charged in each piezoelectric element 42*a* until the drive voltage V becomes the +V voltage. Thus, each piezoelectric element 42*a* starts expanding thereby to contract the volume of each ink reservoir 44*b*, resulting in ejecting ink from each ink ejection hole 45*a*. Although saturated, the drive current I is flowing and is affected by the inductor 64 to cause the undershoot.

At the next time point M, when the drive voltage V of each piezoelectric element 42*a* becomes the +V voltage, the drive current I does not flow any more. However, the drive voltage V is affected by the undershoot of the drive current I to cause the overshoot. Thus, when all the piezoelectric elements 42*a* are driven, as compared with the case in which one of the piezoelectric elements 42*a* is driven, the drive voltage V increases by the amount of the overshoot thereby to expand the piezoelectric elements 42*a* strongly. As a result, it is possible to increase the pressure which is applied from the piezoelectric elements 42*a* to the ink.

Figure 6:
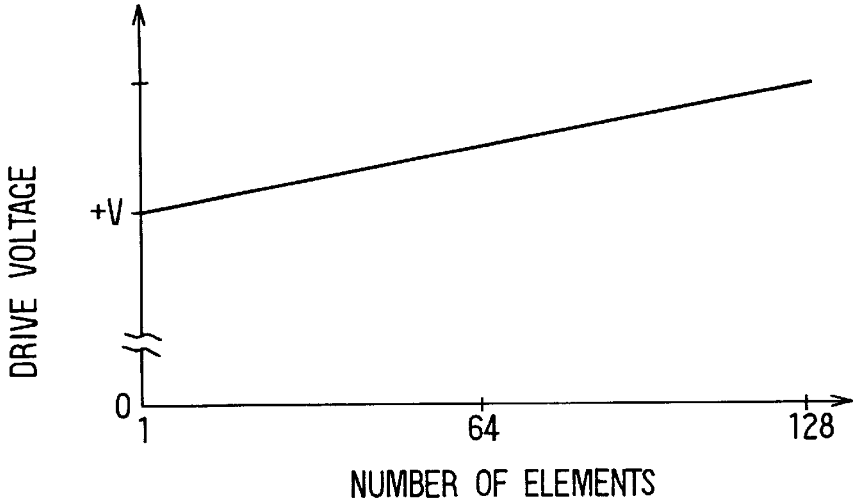
FIG. 6 is a characteristic graph showing measured results of the drive voltage V versus the number of driven piezoelectric elements in the embodiment.

As described above with reference to the two assumed cases, as shown in FIG. 6, the magnitude of the drive voltage V becomes higher in proportion to the number of the driven piezoelectric elements 42*a*. When the number of the driven piezoelectric elements 42*a* increases progressively, the undershoot and the overshoot of the drive voltage due to the inductor 64 also increase progressively, so that the drive voltage V increases. As a result, much more ink can be flown into the ink reservoirs 44*b*. Furthermore, it is possible to increase the pressure applied to the ink.

The above embodiment provides the following advantages.

Figure 7:
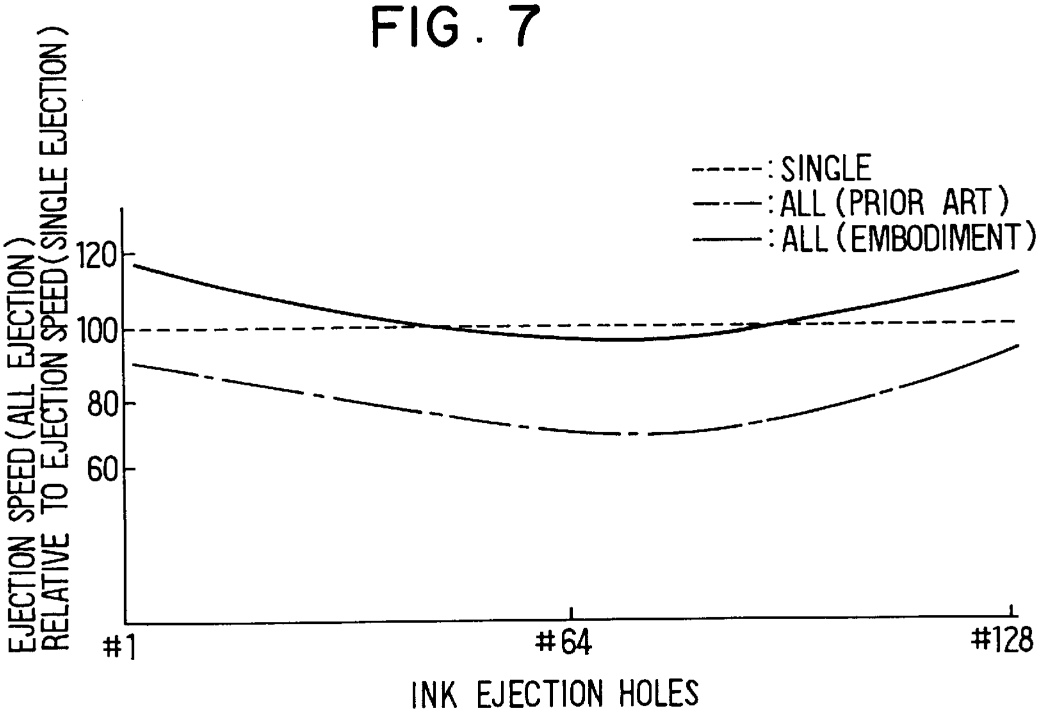
FIG. 7 is a graph showing ink ejection speeds of ink ejection holes in the embodiment.

As shown in FIG. 7, in the conventional apparatus, the speed of ejecting ink from all of the ink ejection holes 45*a* when all the piezoelectric elements 42*a* are driven is generally lowered due to the influence of the crosstalk phenomenon as compared with the speed at which ink is ejected from one ink ejection hole 45*a* when only one piezoelectric element 42*a* is driven. Specifically, the ink ejection speed of the ink ejection holes 45*a* provided at the end of the nozzle plate 45, e.g., ink ejection holes #1, #2, #127, #128 upon all ink ejection is lowered by nearly 10% relative to the ink ejection speed of the single ink ejection. Then, in the ink ejection hole 45*a* defined at substantially the intermediate portion of the nozzle plate 45, e.g., ink ejection holes 45*a* near the ink ejection hole #64 particularly in the full ink ejection, the ink ejection speed is lowered remarkably and lowered by substantially about 30% relative to the ink ejection holes 45*a* near the ink ejection hole #64 upon single ink ejection.

However, according to this embodiment, the ink ejection speed in the single ink ejection is similar to that of the conventional apparatus. The ink ejection speed in the all ink ejection becomes substantially equal to or greater than that of the single ink ejection. More specifically, the ink ejection speed of the ink ejection holes 45*a* provided at the longitudinal end of the nozzle plate 45, e.g., the ink ejection holes #1, #2, #127, #128 upon all ink ejection is raised by about 10% or greater as compared with the ink ejection speed upon single ink ejection. Then, the ink ejection speed of the ink ejection holes 45*a* defined at substantially the intermediate portion of the nozzle plate 45, e.g., ink ejection holes 45*a* near the ink ejection hole #64 can be maintained at substantially the same ink ejection speed as that of the single ink ejection.

Thus, in the printer according to the embodiment, since the undershoot and the overshoot caused in the drive current I by the inductor 64 connected in series with the power supply line 83 become large in proportion to the number of ink ejections, the influence of such drive current causes the drive voltage V to increase in proportion to the number of ink ejections, thereby flowing much more ink into the ink reservoirs 44*b*. Furthermore, it is possible to increase the pressure applied to the ink retained within the ink reservoirs 44*b*.

As a result, even though the number of ejections of the ink from the actuator 40 is increased, much more ink can be flown into the ink reservoirs 44*b* and the pressure applied to the ink can be increased. The decrease in the ink ejection speed due to the influence of the crosstalk phenomenon can be reduced, and an image formed on the paper P becomes more even.

The present invention should not be limited to the disclosed embodiment but may be modified and altered in many other ways.

I claim:

1. An ink ejection control method for an ink jet printer having ink ejection device which includes an ink duct, a plurality of ink reservoirs diverged from the ink duct and having ink ejection holes defined therein and a plurality of piezoelectric elements for expanding/contracting volume of each of the ink reservoirs, the method comprising the steps of:

generating a drive voltage to eject ink from the ink ejection holes by deforming each of the piezoelectric elements;

opening/closing switches for power supply lines through which the drive voltage is applied to the piezoelectric elements respectively; and turning ON/OFF of the switches in response to print data to control application of the drive voltage to the piezoelectric elements, wherein a magnitude of the drive voltage is increased in accordance with an increase in the number of the switches to be turned ON.

2. The control method of claim 1, wherein:

the drive voltage is applied to the switches through an inductor to cause an overshoot and undershoot in the drive voltage when the drive voltage changes.

3. An ink ejection control apparatus for an ink jet printer, comprising:

ink ejection means including an ink duct, a plurality of ink reservoirs diverged from the ink duct and having ink ejection holes defined therein and a plurality of piezoelectric elements for expanding/contracting volume of each of the ink reservoirs;

voltage generating means for generating a drive voltage to eject ink from the ink ejection holes by deforming each of the piezoelectric elements;

a plurality of switch means for opening/closing a power supply path, the power supply path extending from the voltage generating means via a switch means, of the plurality of switch means, to each piezoelectric element of the plurality of piezoelectric elements;

control means for turning ON/OFF each switch means of the plurality of switch means to generate the drive voltage; and an inductor connected in the power supply path originating at the voltage generating means, wherein the drive voltage is changed with an increase in the number of active piezoelectric elements by the inductor.

4. The control apparatus of claim 3, wherein:

the inductor is connected between the voltage generating means and the plurality of switch means to cause an overshoot and undershoot in the drive voltage applied to the plurality of switch means so that a magnitude of the drive voltage is increased with an increase in the number of the piezoelectric elements to be driven.

5. The control apparatus of claim 3, wherein:

the ink ejection means has a cavity plate and a diaphragm placed between the cavity plate and the piezoelectric elements thereby to provide the ink duct, the ink reservoirs and the ink ejection holes.

6. An ink ejection control apparatus for an ink jet printer, the control apparatus comprising:

an ink ejection device having ink reservoirs and ink ejection holes communicated with the ink reservoirs respectively;

deformable elements attached to the ink ejection device for expanding/contracting volume of the ink reservoirs respectively for ejecting ink through the ink ejection holes when driven electrically; and means for increasing deformation of the deformable elements with an increase in the number of deformable elements to be driven so that an expansion/contraction of each volume of the ink reservoirs is correspondingly increased.

7. The ink ejection control apparatus of claim 6, wherein the deformation increasing means includes:

a voltage source for supplying a drive voltage to be applied to the deformable elements; and means for increasing a magnitude of the drive voltage with the increase in the number of the deformable elements to be driven thereby to increase the deformation of the deformable elements.

8. The ink ejection control apparatus of claim 7, wherein the magnitude increasing means includes:

switches connected between the voltage source and the deformable elements for selectively applying the drive voltage to the deformable elements; and an inductor connected between the voltage source and the switches to cause an overshoot and undershoot in the drive voltage to be applied to the switches when the drive voltage changes.

* * * * *